United States Patent
Chien et al.

(10) Patent No.: US 6,958,496 B2
(45) Date of Patent: Oct. 25, 2005

(54) LIGHT-EMITTING SEMICONDUCTOR DEVICE HAVING ENHANCED BRIGHTNESS

(75) Inventors: Wei-En Chien, Chiayi (TW); Chih-Sung Chang, Hsinchu (TW); Chen Tzer-Perng, Hsinchu (TW)

(73) Assignee: United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 10/791,765

(22) Filed: Mar. 4, 2004

(65) Prior Publication Data
US 2005/0082555 A1 Apr. 21, 2005

(30) Foreign Application Priority Data
Oct. 15, 2003 (TW) ........................................ 92128496 A

(51) Int. Cl.[7] ........................................... H01L 29/205
(52) U.S. Cl. ............................. 257/91; 257/86; 257/99
(58) Field of Search ............................. 257/91, 86, 99, 257/80–82, 87, 94, 13

(56) References Cited

U.S. PATENT DOCUMENTS

| | | | | |
|---|---|---|---|---|
| 5,008,718 A | * | 4/1991 | Fletcher et al. | 257/96 |
| 5,488,235 A | * | 1/1996 | Nozaki et al. | 257/94 |
| 2004/0065891 A1 | * | 4/2004 | Shakuda et al. | 257/99 |
| 2004/0169184 A1 | * | 9/2004 | Udagawa et al. | 257/86 |

* cited by examiner

Primary Examiner—Eddie Lee
Assistant Examiner—Douglas W. Owens
(74) Attorney, Agent, or Firm—Troxell Law Office, PLLC

(57) ABSTRACT

This invention this invention provides a light-emitting semiconductor device having enhanced brightness, to ensure even current distribution emitted by a front contact of the light emitting diodes so as to improve the light-emitting efficiency of the active layer. This invention adopts the method to manufacture the light-emitting device, comprising the steps of: forming an active layer on a substrate; forming a capping layer on the active layer to enhance current distribution, where a back contact is located on another side of the substrate and a front contact is located above the capping layer. This invention is characterized by: re-designing the front contact, by reducing the width of a metallic pattern constructing fingers or Mesh lines and increasing the number of the fingers or Mesh lines, so as to resolve the current crowding problem.

9 Claims, 7 Drawing Sheets

LIGHT-EMITTING SEMICONDUCTOR DEVICE HAVING ENHANCED BRIGHTNESS

BACKGROUND OF THE INVENTION

1. Field of the Invention

This invention relates to a light-emitting semiconductor device having enhanced brightness, particularly to one for enhancing current distribution of a front contact in a light emitting diode, so as to enhance the light emitting efficiency of a light-emitting semiconductor.

2. Background of the Invention

The principles lying behind luminance of light emitting diodes relate to passing current sequentially through P-N junctions of a semiconductor to generate light, wherein AlGaInP is implemented in high brightness red, orange, yellow and yellowish green LEDs, AlGaInN is in blue and green LEDs. The process of metal organic vapor phase epitaxy (MOVPE) is commonly adopted in the mass production of the LEDs, while the light-emitting components are of the structures, including: homo-junction (HOMO), single-heterostructure (SH), double-heterostructure (DH), single-quantum well (SQW) and multiple-quantum well (MQW) or other appropriate structures.

The structure of a conventional light emitting diode is illustrated in FIG. 1A, including, from the top down, a front contact 11, an active layer 12, a substrate 10 and a back contact 13. The active layer 12 is formed by a light-emitting material, such as AlGaInP or AlGaInN by adopting MOVPE. After current is injected through the front contact 11, the current will pass through the active layer 12 and the substrate 10 to flow towards the back contact 13. Light is emitted when the current flows through the active layer 12. However, the low carrier mobility and high resistance of the active layer made of AlGaInP or AlGaInN results in poor electric conductivity of the AlGaInP or AlGaInN. When current is applied to the front contact located above the active layer 12, even if a capping layer 14 (or window layer) is added to enhance the current distribution to make minor improvements to the current distribution, the current is still concentrated at the lower portion of the contact such that the primary emitting regions are mainly concentrated at and next to the lower portion of the contact, as illustrated in FIG. 1B.

The refractive index (n=3.4~3.5) of most materials for making semiconductor LEDs is greater than the surrounding refractive index (n=1~1.5, n=1.5 for epoxy). In other words, a great portion of the light emitted by a semiconductor LED is completely reflected back to the semiconductor by the interface between the semiconductor and its exterior epoxy. The portion of the light that has been completely reflected is then absorbed by the active layer, the contacts and the substrate thereby reducing the actual luminance beneficial results of the LED (as shown in FIG. 1C).

To enhance the current distribution, improvements have been made to the structures and materials, such as that disclosed in U.S. Pat. No. 5,008,718 by Fletcher et al., where a capping layer 15 (or window layer), made of GaP, GaAsP and AlGaAs having a low resistance value and being pervious to light, is added between the front contact and active layer, as shown in FIG. 1D. The objective of using this capping layer is to enhance the current distribution flowing from the front contact. As described in the '718 patent, to improve the current distribution, the capping layer is preferred to be in the range from 150 to 200 micrometers thick to enhance the luminous intensity by 5 to 10 times.

However, the increasing thickness of the capping layer also increases the time and cost required for MOVPE epitaxy thereby significantly increasing the cost of the epitaxy. In addition, the distribution ability is extremely relevant to the thickness. Hence, to ensure even current distribution, the thickness must be at least 10 micrometers or the current crowding problem cannot be effectively resolved.

Another measure is to change the design of contacts. F. A. Kish and R. M. Fletcher suggested re-designing the contacts to include fingers 16 (as shown in FIG. 1E) or extended with Mesh lines 17 (as shown in FIG. 1F), to resolve the current crowding problem in LEDs. The result, however, is not satisfactory because the inherent width of the Mesh lines extending from the contacts usually ranges from 5 to 25 micrometers to ensure easy production. The number of fingers or Mesh lines of such a width must be limited in order to prevent excessive masking of light, such that the light emitted below the contacts would all be masked by the fingers or Mesh lines. Since the current located exactly below the contacts are most intensive to result in intensive illumination, the metal meshes mask the regions that are intensively illuminated. However, reducing the number the metal meshes will cause poor current distribution at some of the luminous regions E so as to affect the light-emitting effects (as shown in FIGS. 1G to 1H).

To improve the current distribution, this invention discloses another design for the contacts so as to provide even current distribution and to reduce the regions masked by the contacts thereby enhancing the brightness.

SUMMARY OF THE INVENTION

It is a primary objective of this invention to provide a light-emitting semiconductor device having enhanced brightness. The line width of the meshes of the metallic patterns constructing the front contact ranges from 0.1 to 5 micrometers, thereby enhancing the light-emitting efficiency.

It is another objective of this invention to provide a light-emitting semiconductor device having enhanced brightness. The metallic patterns constructing the front contact may be meshed, dotted, checkered or another other geometrical patterns that are evenly distributed above the entire active layer.

It is a further objective of this invention is to provide a light-emitting semiconductor device having enhanced brightness. The metallic patterns constructing the front contact does not mask the light illuminated by the active layer because the line width of the metallic patterns is less than 5 micrometers.

To achieve the above objectives, this invention adopts the method comprising the steps of: forming an active layer on a substrate; forming a capping layer on the active layer to enhance current distribution, where a back contact is located on another side of the substrate and a front contact is located above the capping layer. This invention is characterized in that, the front contact is re-designed to reduce the width of fingers or Mesh lines of metallic patterns and to increase the number of the fingers or Mesh lines, so as to resolve the current crowding problem. When the width of fingers or Mesh lines in metallic pattern is shrunk to about 2 micrometers, the light emitted is still visible through the capping layer at a light-emitting dispersion angle between 7.6 and 18 degrees, even the region of the active layer is exactly below the Mesh lines, where the region is the most current intensive region. Therefore the light-emitting efficiency is significantly improved.

BRIEF DESCRIPTION OF THE DRAWINGS

These and other modifications and advantages will become even more apparent from the following detained description of preferred embodiments of the invention and from the drawings in which.

DETAILED DESCRIPTION OF THE INVENTION PREFERRED EMBODIMENTS

This invention may be implemented in enhancement of current distribution in light emitting diodes, by re-designing the front contact to enhance the light-emitting efficiency. The material of an active layer and a substrate may be modified based on the light wavelength of diodes. However, such modifications are not the features of this invention. In this invention, all examples use the term "active layer" to represent the primary structure of the LED component, including homo-junction, single-heterostructure, double-heterostructure, single-quantum well or multiple-quantum well.

EXAMPLE I

Figure 2A:
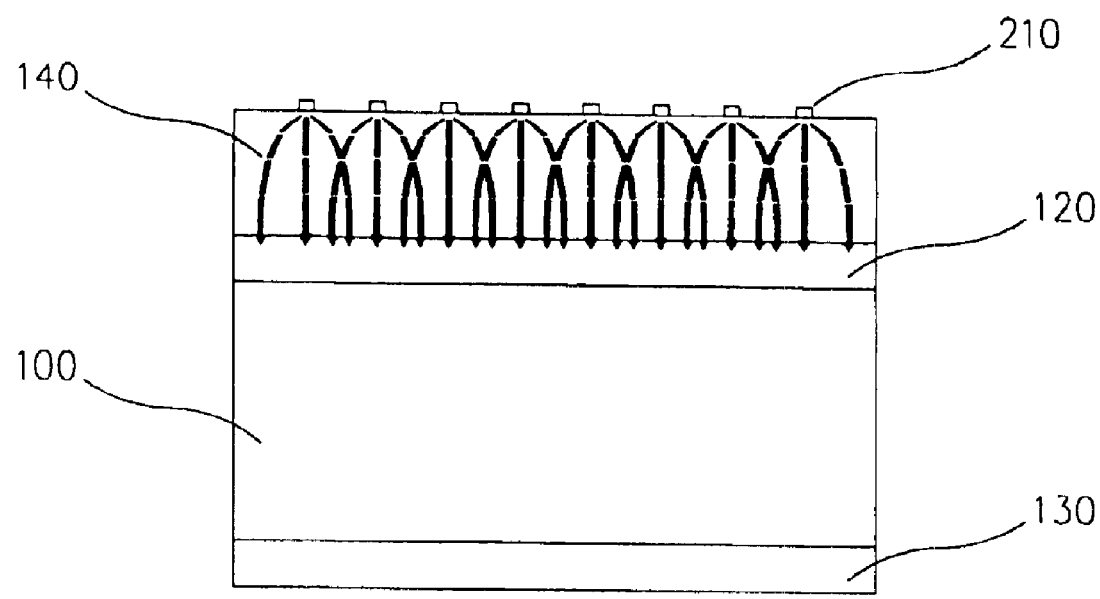
FIG. 2A is a cross-sectional view illustrating the current distribution within a first embodiment of a light emitting diode according to this invention.

In Example I, a light emitting diodes (LED) is used to describe the features of this invention. FIG. 2A is a cross-sectional view of a light emitting diode. First, an active layer 120 is formed above a substrate 100. The active layer may be of a double-heterostructure or a quantum well structure to enhance the light-emitting efficiency of the diode. Then, a capping layer 140 made of GaP, AlGaAs or ITO is then added above the active layer to improve the current distribution. A back contact 130 is located on another side of the substrate 100, and a front contact 210 is located above the capping layer 140.

In detail, the material of the substrate 100 is dependent on the material of the active layer 120. When the active layer 120 is made of AlGaInP or AlGaAs, GaAs is selected to form the substrate. When the active layer 120 is made of AlGaInN. Any of sapphire, SiC, $MgAlO_4$, ZnO, $LiG2O_2$ and $LiAlO_2$ may be selected to form the substrate. The active layer is preferably between about 0.3 to 3 micrometers thick. The capping layer 140 is between about 10 and 50 micrometers thick. Both the active layer 120 and the capping layer 140 are formed by adopting MOVPE or Molecular Beam Epitaxy (MBE).

This invention discloses an effective measure to resolve the current problem. The front contact is re-designed to reduce the width of fingers or Mesh line in the metallic pattern associated with increasing the number of the fingers or Mesh lines, the current crowding problem and the light-emitting efficiency enhancement of the light-emitting diode are thus improved. The metallic pattern shown in FIGS. 2A and 2B are only an exemplified pattern, which does not intend to limit the scope of this invention.

Figure 2B:
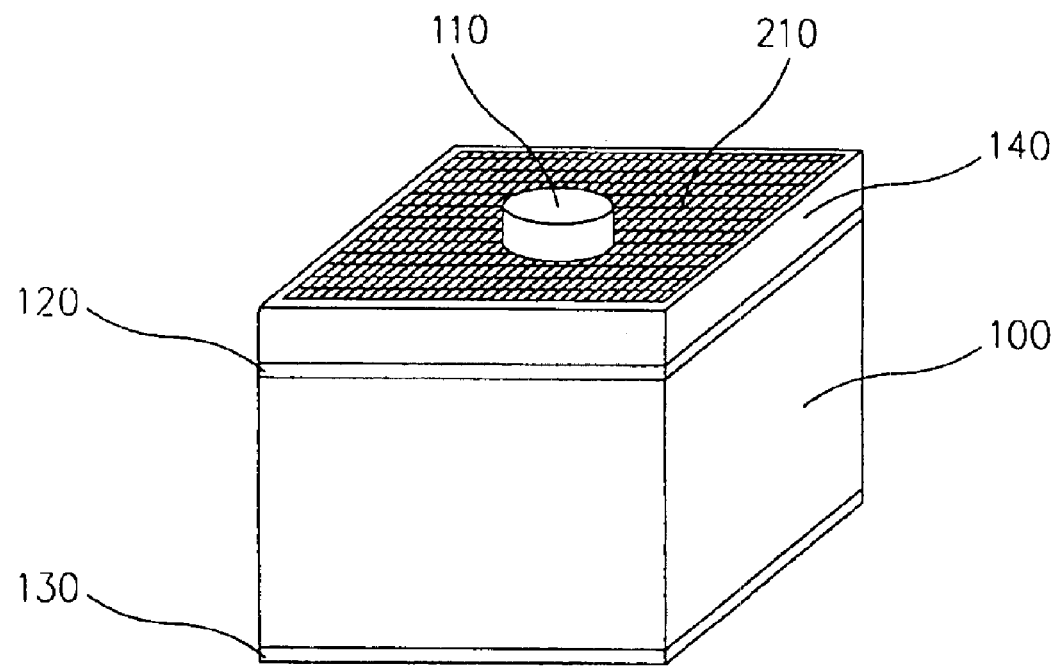
FIG. 2B is a top plane illustrating a metallic mesh formed by a front contact within a light emitting diode structure.

FIG. 2B illustrates a top view of the diode. The contact 110 implemented in Example I still retains a metallic bonding pad for contacting the exterior. However, next to the contact 110 is completely arranged with metallic meshes 210 above the active layer 120. The metallic meshes 210 interconnect with the contact 110, to jointly serve as the front contact of Example I.

Figure 2C:
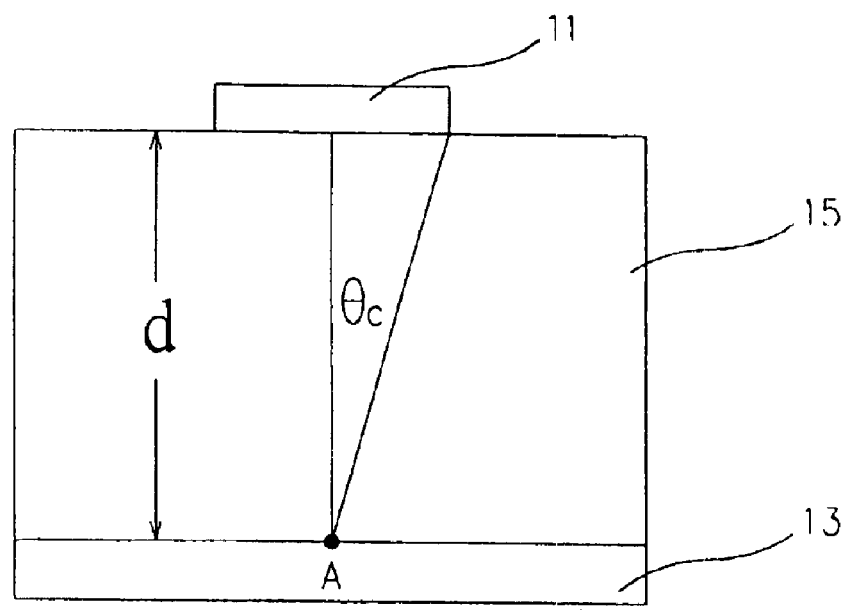
FIG. 2C is a cross-sectional view illustrating the light emitting structure located exactly below the contacts in prior art.

In a conventional light emitting diodes, the front contact has Mesh lines whose width are mostly in the range of 5 to 25 micrometers. As a result, the current can only be distributed to about 40 micrometers away from the Mesh lines, which leave a light-emitting depletion region of greater than 80 micrometers between two Mesh lines. Generally, the current just below the contacts is the most intensive region than others, as is shown in FIG. 2C. If the capping layer 15 has a thickness of 15 micrometers and the Mesh line 11 of the front contact each has a width of 15 micrometers and is spaced between two Mesh lines by 60 micrometers and when the current is spread from a point A in the active layer 12 that is located exactly below the Mesh line 11, the minimum light-emitting dispersion angle must be greater than a halved width of the front contact, or the light emitted from point A in the active layer 12 will be masked by the Mesh line 11. The minimum light-emitting dispersion angle $\theta_m$ can be calculated as follows:

$\tan \theta_m = 7.5/15 = 1/2 \rightarrow \theta_m \approx 26.5°$ for thickness of the capping layer is 15 µm and a halved width of the mesh line 11 of the front contact is 7.5 µm.

However, for most of the material used for light emitting diodes, the total reflection angle is approximately 18 degrees. In other words, when the incident angle θ of the light is greater than 18 degrees, the light will be totally reflected backward to the semiconductor while meeting the semiconductor surface. When the light generated in the light-emitting layer is dispersed by radiation, complete reflection will be observed outside the range of θc. On the other hand, light will penetrate through the capping layer within the range of θc. Therefore, when the width of the mesh is greater than 15 micrometers, those light emitted exactly below the mesh will be completely blocked by the mesh, thereby affecting the light-emitting efficiency significantly.

Figure 1A:
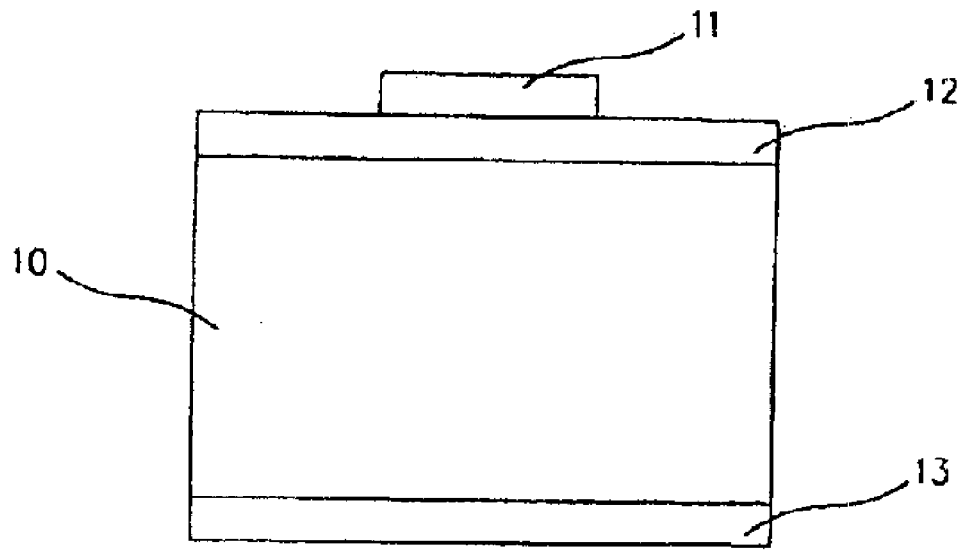
FIG. 1A is a cross-sectional view illustrating a conventional light emitting diode structure.
Figure 1B:
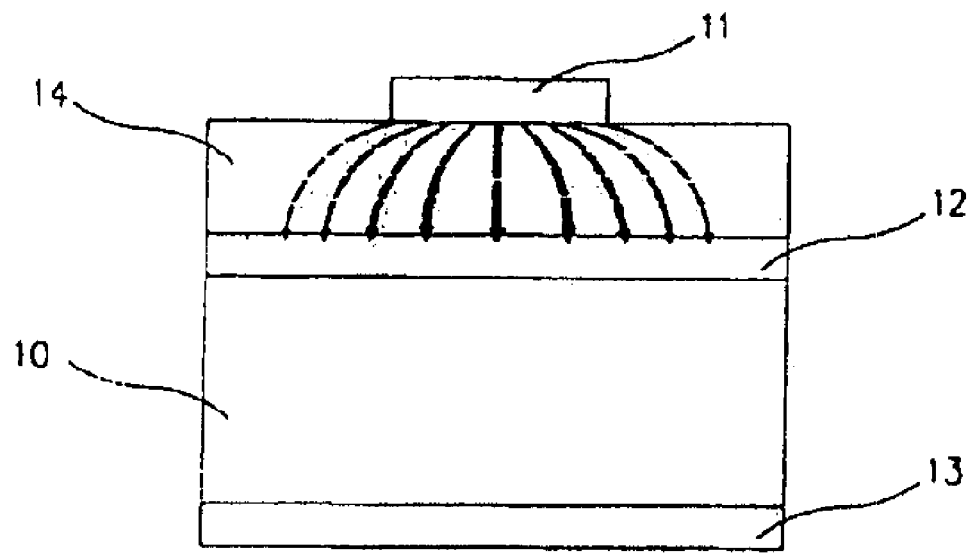
FIG. 1B is a cross-sectional view illustrating the current distribution within a conventional light emitting diode structure.
Figure 1C:
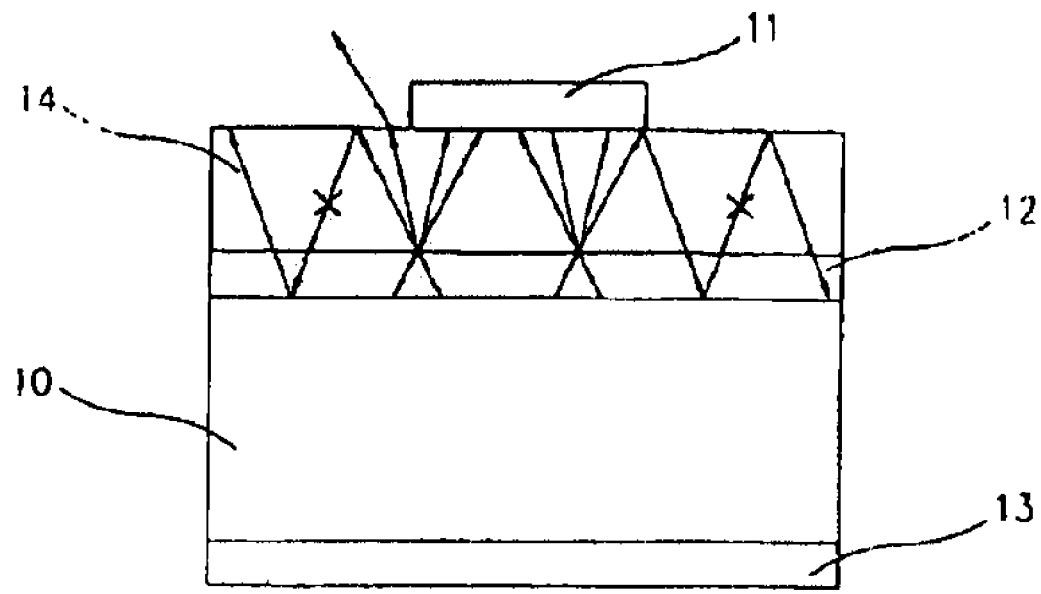
FIG. 1C is a cross-sectional view illustrating illumination of light within a conventional light emitting diode structure.
Figure 1D:
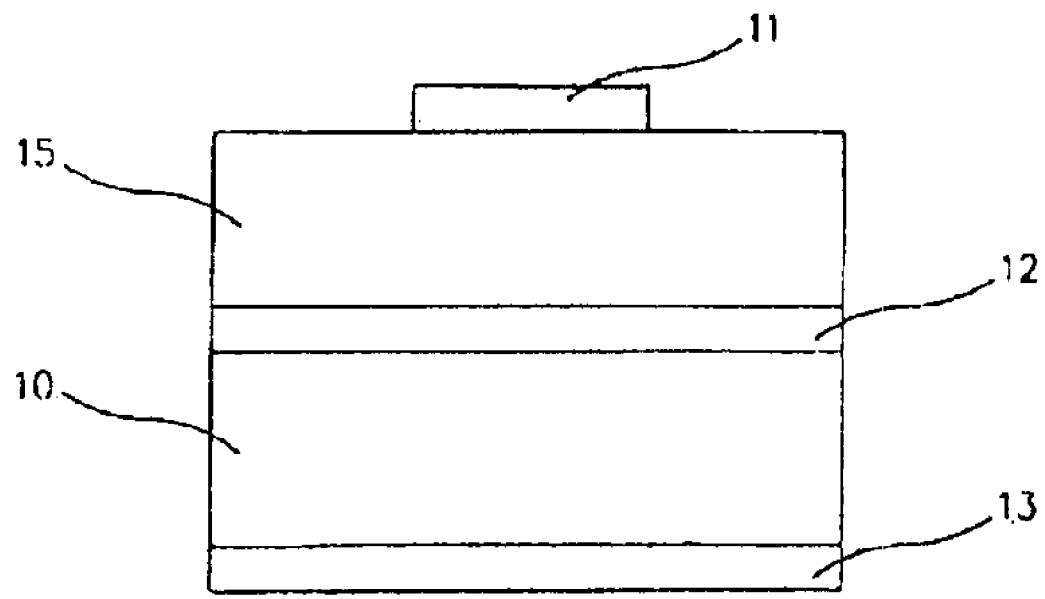
FIG. 1D is a cross-sectional view illustrating a conventional light emitting with an addition of a capping layer structure.
Figure 1E:
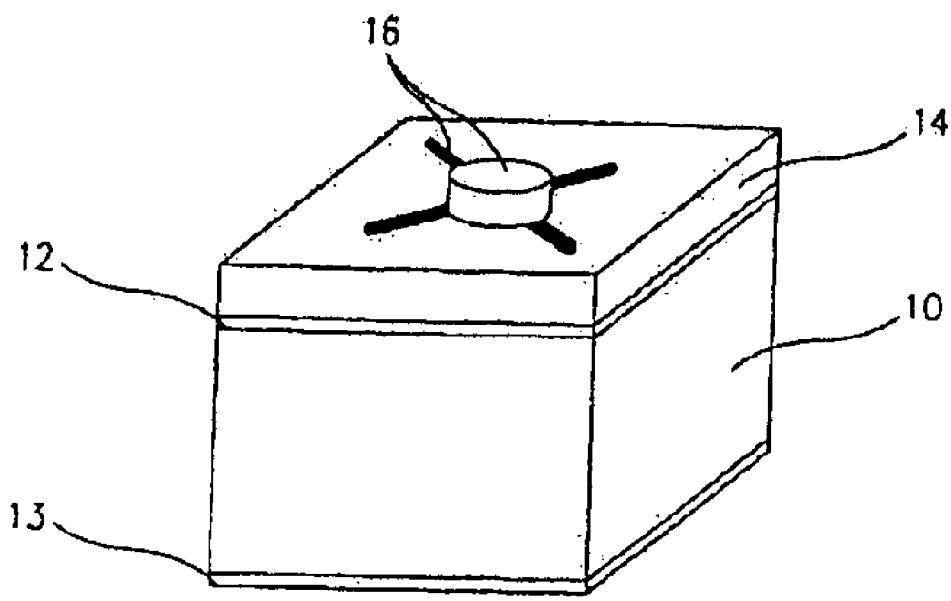
FIG. 1E is a top view illustrating fingers extended from a front contact within a conventional light emitting diode structure.
Figure 1F:
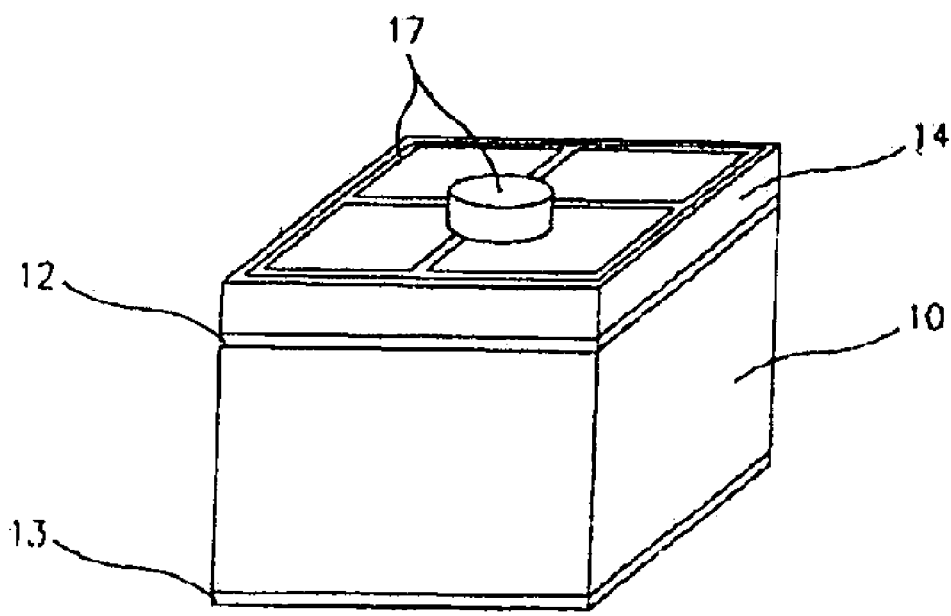
FIG. 1F is a top plane view illustrating Mesh lines extended from a front contact within a conventional light emitting diode structure.
Figure 1G:
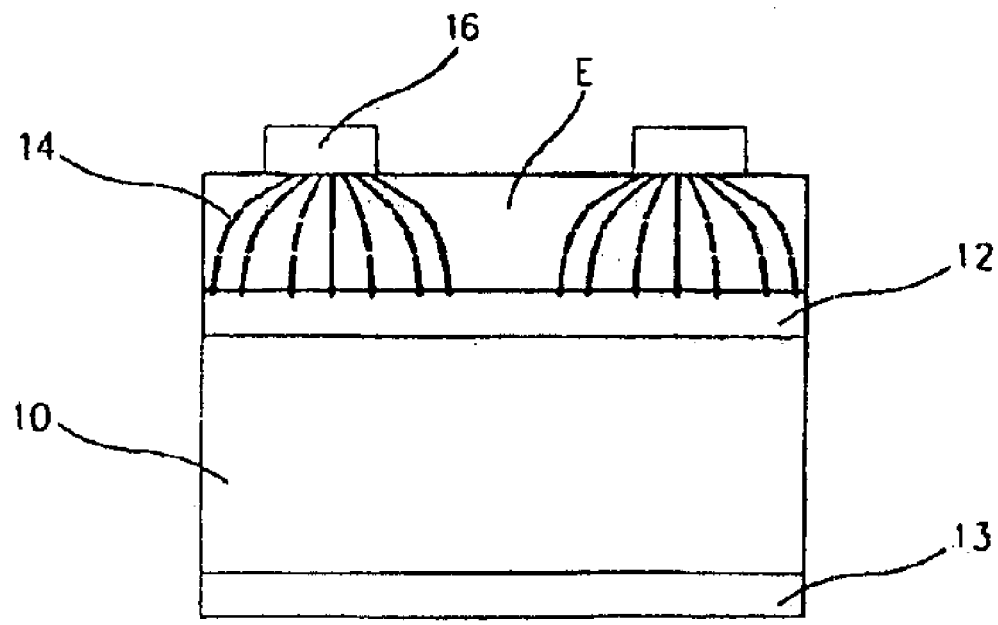
FIG. 1G is a cross-sectional view illustrating the current distribution within a conventional light emitting diode structure having fingers of Meshed lines extended form a front contact.
Figure 1H:
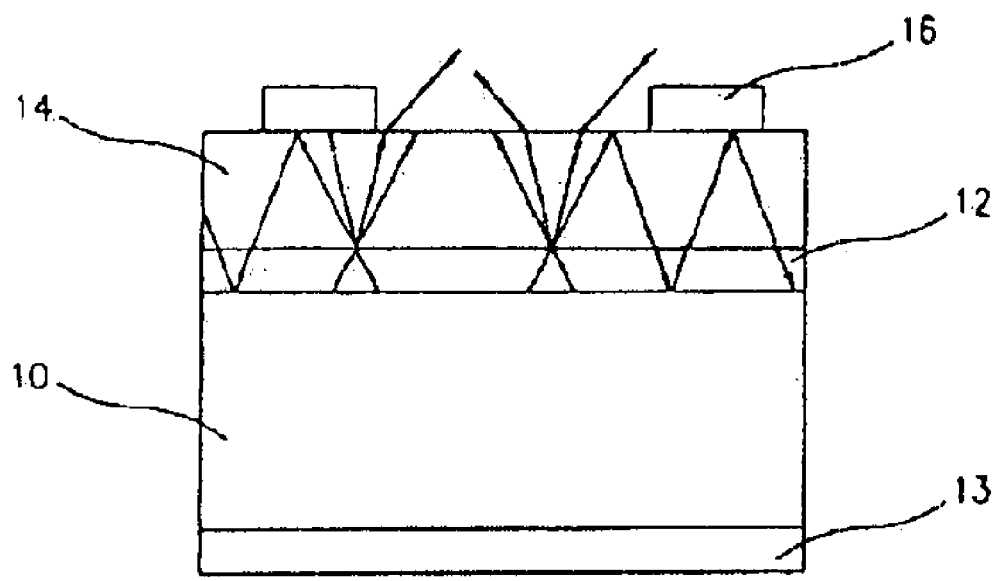
FIG. 1H is a cross-sectional view illustrating illumination of light within a conventional light emitting diode structure having fingers of Meshes lines extended from a front contact.

According to the present invention, each of the coarse Mesh lines shown in FIG. 1G is divided into several of equal-distant metallic meshes 210, as shown in FIG. 2B. The line width of the metallic meshes 210 suggested in Example I are dimensioned to be between about 0.5 to 5 micrometers, which are evenly distributed above the substrate. Base on the above calculations, if the line width of the meshes is dimensioned down to 2 micrometers with a capping layer having a thickness of 15 micrometers, the minimum light-emitting dispersion angle $\theta_m$ is calculated by: $\tan \theta_m = 2/15 \rightarrow \theta_m \approx 7.6°$.

The minimum light-emitting dispersion angle $\theta_m$ is significantly reduced. The light emitted from the current intensive region that is located exactly located below the contact, can now penetrate through the capping layer if the light-emitting dispersion angle is within the range of θ32 7.6 to 18 degrees. Consequently, the light-emitting efficiency will be enhanced significantly.

EXAMPLE II

Figure 2D:
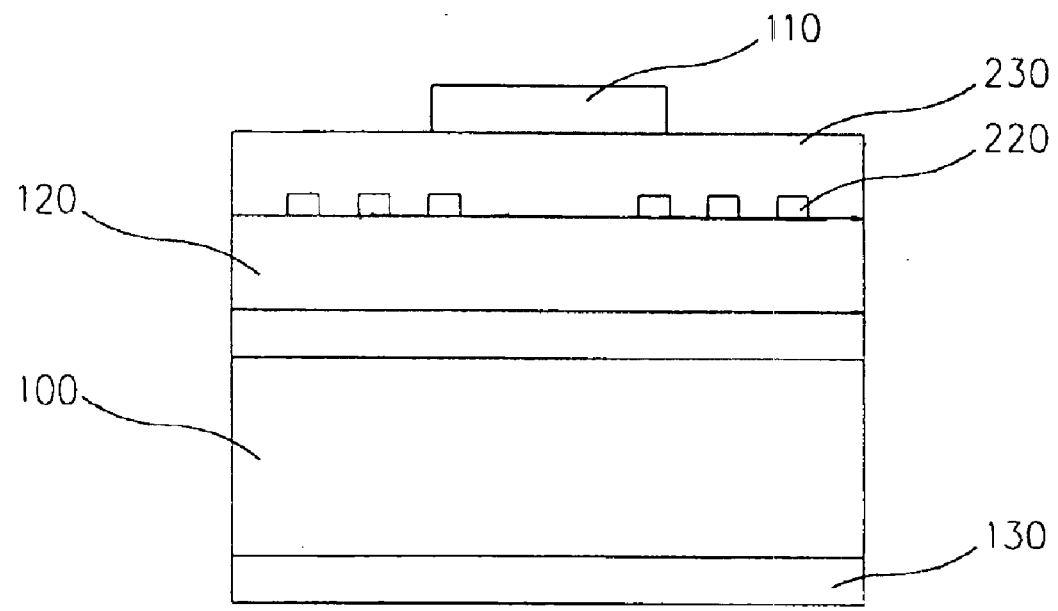
FIG. 2D is a cross-sectional view illustrating a second embodiment of a light emitting diodes according to this invention.

A further light emitting diode (LED) embodiment according to the present invention is shown in FIG. 2D, the Example II. FIG. 2D is a cross-sectional view of a light emitting diode, having a back contact, a substrate, an active layer and a capping layer that have the same structures as those in Example I. According to this invention, the substrate may a semiconductor substrate or any other appropriate substrates dependent on the applications of the LED.

Figure 2E:
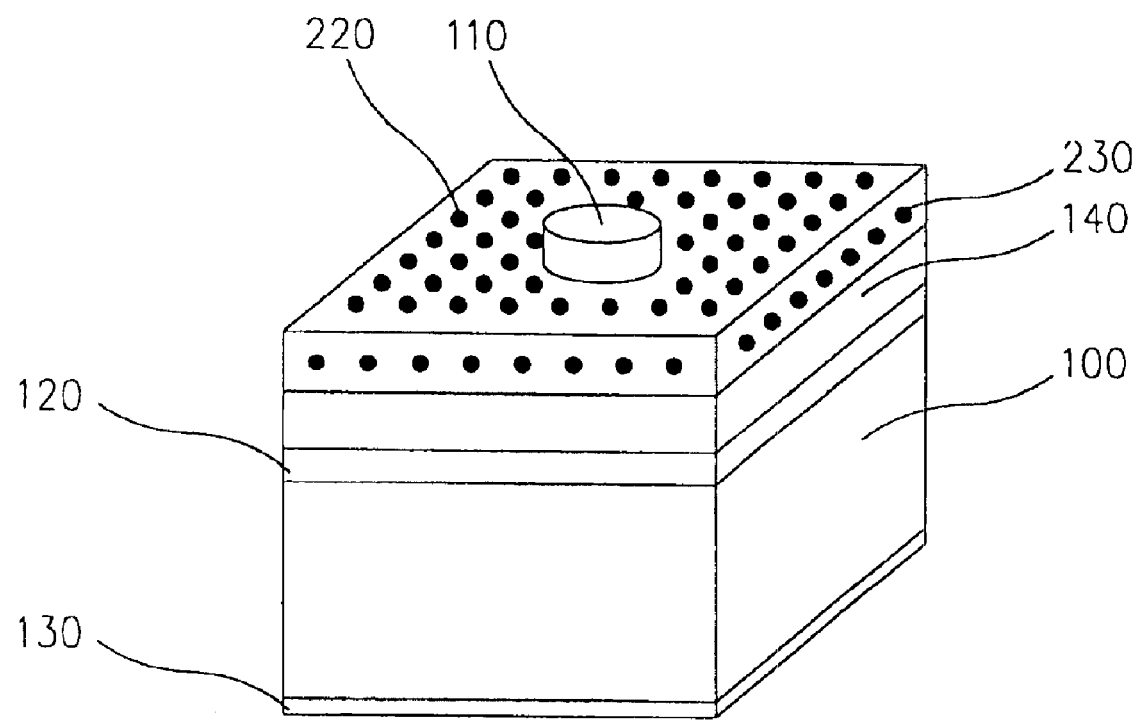
FIG. 2E is a view illustrating metallic dots formed by a front contact within a light emitting diode structure.

Example II is characterized by a front contact that is divided into two layers, as shown in FIG. 2E. The metallic bonding pad—a first layer 110 of the front contact, is the same as that adopted in the conventional light emitting diodes. A second layer 220 of the front contact is located below the first layer 110 and embedded in an ITO layer 230 and in a form of numerous dots so as to resolve the current crowding problem and to enhance the light-emitting efficiency of the light emitting diode. The dots are each dimensioned to 0.1 to 5 micrometers and evenly distributed above the active layer. The pattern of metallic dots significantly reduce the region where the light emitted by the active layer is masked by the front contact, and enables even current distribution to enhance the light-emitting efficiency. Other than metallic dots in Example II, the second layer 220 may be in a form of the metallic meshes as suggested in Example I or any other metallic patterns.

The spirits of this invention, however, reside in the arrangement of the front contact above the active layer, with the metallic patterns constructing the front contact being dimensioned to 0.1 to 5 micrometers. So long as the metallic patterns having line width or dots are dimensioned to be sufficiently small so as to prevent the active layer just under the mesh lines or dots from masking most of the light emitted, the metallic patterns may be configured to any geometrical designs.

This invention is related to a novel creation that makes a breakthrough in the art. Aforementioned explanations, however, are directed to the description of preferred embodiments according to this invention. Since this invention is not limited to the specific details described in connection with the preferred embodiments, changes and implementations to certain features of the preferred embodiments without altering the overall basic function of the invention are contemplated within the scope of the appended claims.

What is claimed is:

1. A light-emitting semiconductor device having enhanced brightness, comprising:
   (a) a semiconductor substrate;
   (b) an active layer located above the semiconductor substrate, for inducing illumination of light;
   (c) a conductive back contact located below the semiconductor substrate; and
   (d) a conductive front contact located above the active layer, the front contact including a metallic bonding pad and ohmic contact having a minimum dimension ranging between 0.1 and 5 micrometers and distributed above the active layer.

2. The light-emitting semiconductor device having enhanced brightness of claim 1, wherein the semiconductor substrate is GaAs.

3. The light-emitting semiconductor device having enhanced brightness of claim 2, wherein the active layer is AlGaInP.

4. The light-emitting semiconductor device having enhanced brightness of claim 2, wherein the active layer is AlGaAs.

5. The light-emitting semiconductor device having enhanced brightness of claim 1, wherein the semiconductor substrate is sapphire.

6. The light-emitting semiconductor device having enhanced brightness of claim 4, wherein the active layer is AlGaInN.

7. The light-emitting semiconductor device having enhanced brightness of claim 1, wherein the metallic patterns of the front contact is configured to an interconnected mesh and in electrical connection with the metallic bonding pad.

8. The light-emitting semiconductor device having enhanced brightness of claim 7, wherein the metallic patterns of the front contact are embedded and interconnected in an ITO layer.

9. A light-emitting device having enhanced brightness, comprising:
   (a) a substrate;
   (b) an active layer located above the substrate, for inducing illumination of light;
   (c) a back contact located below the substrate; and
   (d) a front contact located above the active layer, the front contact including a metallic bonding pad and ohmic contact metallic patterns, the metallic patterns of the front contact having a minimum dimension ranging between 0.1 and 5 micrometers and distributed above the active layer.

* * * * *